United States Patent [19]

Kosonocky

[11] 3,971,003

[45] July 20, 1976

[54] CHARGE COUPLED DEVICE IMAGER

[75] Inventor: Walter Frank Kosonocky, Skillman, N.J.

[73] Assignee: RCA Corporation, New York, N.Y.

[22] Filed: Nov. 18, 1974

[21] Appl. No.: 524,829

[52] U.S. Cl.............................. 340/173 R; 307/238
[51] Int. Cl.²......................................... G11C 11/40
[58] Field of Search............ 340/173 R; 307/221 C, 307/238

[56] References Cited
UNITED STATES PATENTS

| | | | |
|---|---|---|---|
| 3,643,106 | 2/1972 | Berwin | 340/173 R |
| 3,763,480 | 10/1973 | Weimer | 340/173 R |
| 3,797,002 | 3/1974 | Brown | 340/173 R |

*Primary Examiner*—Terrell W. Fears
*Attorney, Agent, or Firm*—H. Christoffersen; Samuel Cohen

[57] ABSTRACT

The columns in known frame transfer type charge coupled device (CCD) image sensing arrays generally are spaced, center-to-center, a distance equal to the length of a stage in the C register. In the present array the center-to-center spacing of the columns is considerably reduced to obtain improved resolution in the row direction. The spacing is only $1/n$'th of the length of each such C register stage, where $n$ is the number of phases employed to operate the C register. The array is read out to the C register via a special electrode structure, $1/n$'th of a row at a time, and the C register is read out in such a way that the row is reconstructed while being read from the C register. The special electrode structure temporarily stores a row of information and permits the $1/n$'th of the row to be removed at a time. It also provides a potential barrier to isolate the C register during the time the C register is being read out.

8 Claims, 20 Drawing Figures

CHARGE COUPLED DEVICE IMAGER

The present application deals with the readout of information from a charge transfer imager, and particularly with the problem in a frame transfer CCD imager, of increasing the horizontal resolution, that is, increasing the resolution in the row direction. Such resolution is a function of the center-to-center spacing of the columns and this, in turn, is dependent upon the minimum width of each column. Photolithographic techniques are available to reduce the column widths to smaller than their present values; however, the limiting factor, at present, is the length of each stage in the C register. In the present state of the art, each column must align with at least one electrode of a C register stage and therefore the columns cannot be placed closer to one another center-to-center, than the length of such a stage.

In a system embodying the present invention, each column need align with an electrode in only each $1/n$'th stage of the C register, where $n$ is the number of phases employed to operate the C register. A row of information is read into the C register $1/n$'th of a row at a time via a special electrode structure with temporary storage, transfer, and isolation properties. The row is reconstructed to its original form during the readout of the C register.

Figure 1:
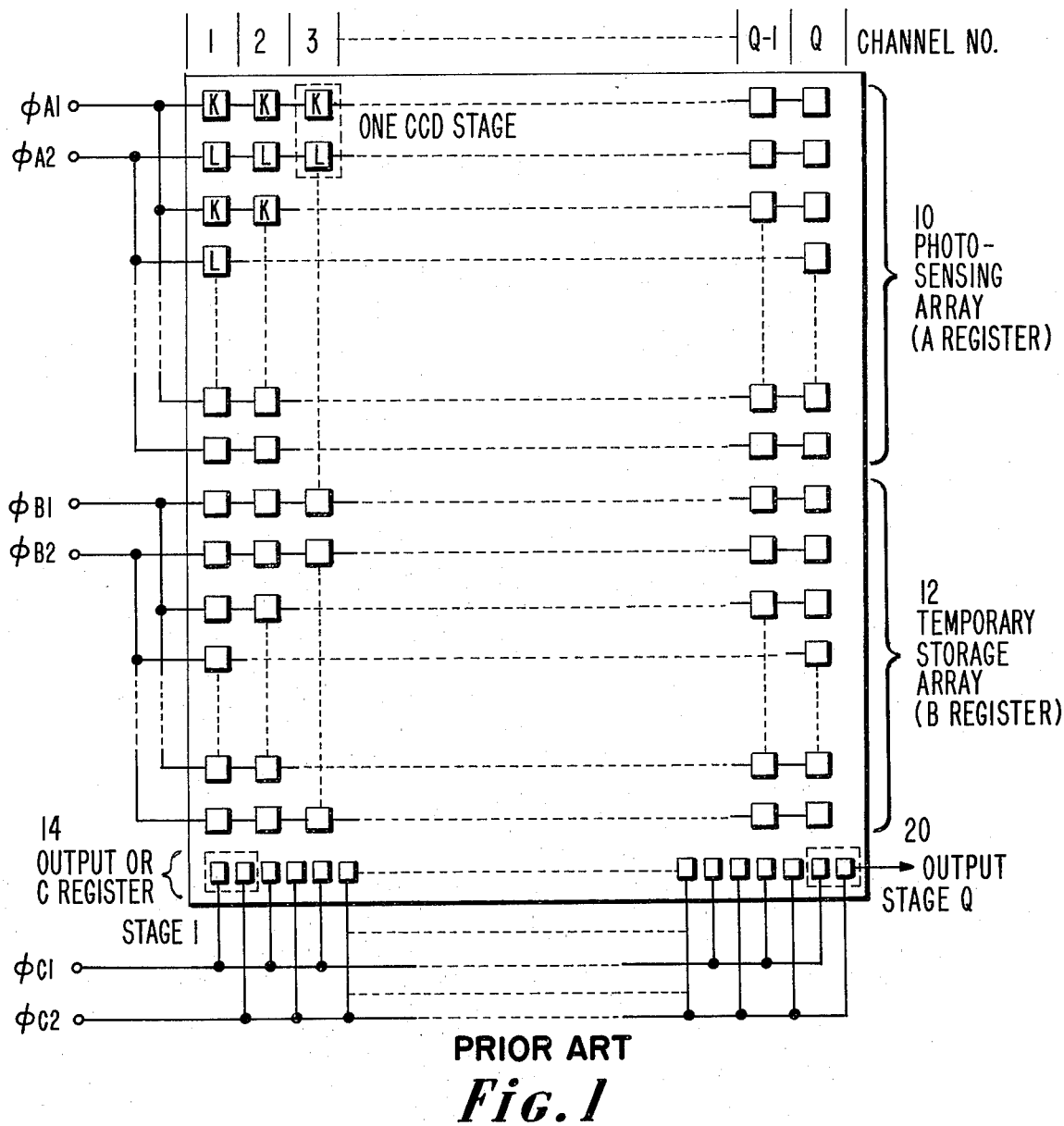
FIG. 1 is a block diagram of a prior art image sensing array.
Figure 2:
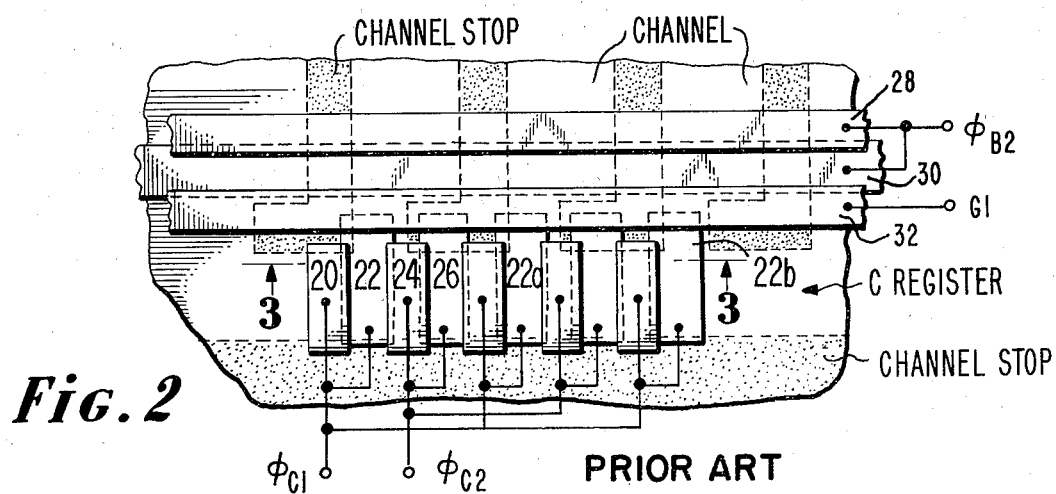
FIG. 2 is a more detailed showing of portions of the B and C registers.
Figure 3:
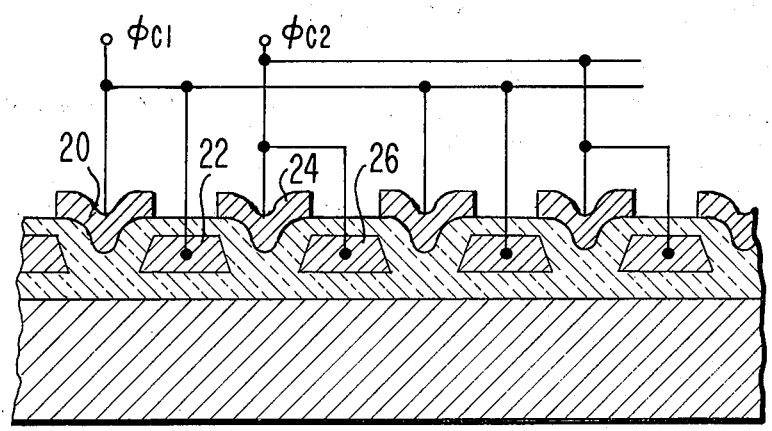
FIG. 3 is a section taken through a portion of the C register.

The principal feature dealt with in the present application may be best understood by referring first to FIGS. 1–3. The system of FIG. 1, a two phase charge-coupled device (CCD) imager, includes a photosensing array 10, sometimes known as an A register, a temporary storage array 12, sometimes known as a B register, and an output register 14, sometimes known as a C register. The operation of this array is well understood. During the so-called integration time, a scene or other image is projected onto the A register while the B register is masked. The light or other radiant energy of the image causes charges to be produced at the various locations of the A register, in accordance with the light intensity reaching the respective locations.

Upon the completion of the integration time, the charge signals which have accumulated are transferred, in parallel, in the columnar direction from the A to the B register by the application of the multiple phase voltages $\phi_{A1}$, $\phi_{A2}$, $\phi_{B1}$ and $\phi_{B2}$. The charges subsequently are transferred, a row at a time, from the B register to the C register and the charges are then serially shifted out of the C register in response to the shift voltages $\phi_{C1}$, $\phi_{C2}$. During the transfer from the B to the C register, a new field may be integrated in the A register.

It is desirable, in the interest of obtaining high resolution, to make the columns of the array as narrow as possible and to place the columns as close to one another as possible. However, each column aligns with one of the electrodes in a different stage of the C register. This is seen perhaps most clearly in FIGS. 2 and 3. Each C register stage comprises four electrodes. One pair of electrodes of each stage such as 20, 22, is driven by one of the phases and the other pair of electrodes, such as 24, 26, is driven by the other phase. One electrode of each pair may be made of metal, such as aluminum, and the other electrode, such as 22, may be formed of polysilicon, or all electrodes may be formed of polysilicon. Other structures also are possible.

In the operation of the system of FIG. 2, after a row of charge signals is stored beneath the last electrode pair 28, 30 in each column of the B register, a signal G is supplied to the gate electrode 32 and these charge signals are transferred, in parallel, to the potential wells beneath electrode 22, 22a, 22b, and so on. Subsequently, the charge signal is shifted from beneath electrode 22 to beneath electrode 26 by reducing the value of $\phi_{C1}$ and increasing the value of $\phi_{C2}$, and so on.

It is clear from the illustration and from the discussion that the center-to-center spacing of the vertical channels can be no closer than the length of one stage in the C register. The horizontal resolution therefore also can be no better than the minimum length of a stage (such as 20, 22, 24, 26) of the C register. In the present state of the integrated circuit art, in a two-phase system, such as illustrated, the length of each stage of the C register is about 0.8 to 1.2 mil at a minimum, in a CCD imager of practical design. Thus, the columns of the array (a column is equal to the width of the channel plus the width of the channel stop) must be at least this same width. While illustrated in terms of a two-phase system, the same problem exists in three, four and higher phase systems.

Figure 4:
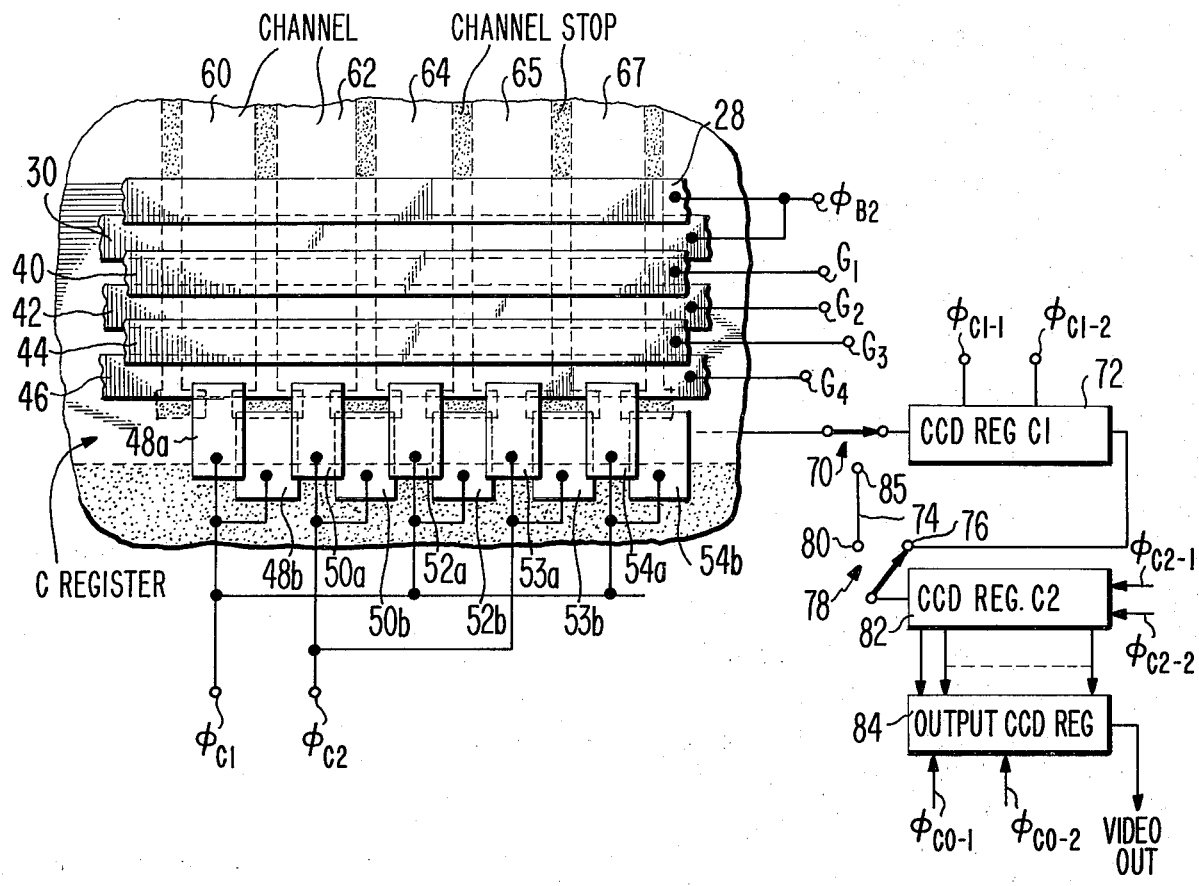
FIG. 4 is a plan view, partially in block form, of a portion of a CCD imager embodying the invention.

In the embodiment of the invention illustrated in FIG. 4, which is also a two-phase system, the column width need only be equal to the length of one half a stage of the C register. (In general the width need only be L/N, where L is the length of the register stage and N the number of phases.) The FIGURE illustrates only the electrodes 28, 30 of the last row of the B register. There are four gate electrodes 40, 42, 44 and 46 following these two electrodes. Electrodes 42 and 46 may be considered storage electrodes and they are relatively close to the substrate, and electrodes 40 and 44 may be considered transfer electrodes and they are relatively further from the substrate.

The C register comprises electrode pairs 48a, 48b, 50a, 50b, and so on. The transfer electrode 48a of the half register stage 48a–48b aligns with channel 60. The transfer electrode 50a of the half stage 50a, 50b aligns with channel 62. The electrode 52a of half stage 52a, 52b aligns with channel 64 and so on. Channel stop diffusions separate the channels, in conventional fashion. In the present register, the a electrodes which operate as transfer electrodes, are spaced further from the substrate than the b electrodes, which are used as the storage electrodes. Other forms of construction in which the potential well asymmetry required for two phase operation is obtained in other ways are, of course, possible.

The C register is connected through a switch 70 either to the C1 register 72 or to lead 74. The output terminal of register 72 connects to one of the contacts 76 of switch 78. Lead 74 connects to the other contact 80 of the switch 78. While for purposes of the present explanation, the switches 70 and 78 are illustrated as mechanical switches, in practice electronic charge-coupling switches are employed. Switch 78 connects to the input terminal of another CCD register 82. The stages of register 82 are connected, in parallel, to corresponding stages of the output register 84.

In the operation of the system of FIG. 4, assume that a row of information is stored beneath the last electrode pairs 28, 30 of the B register. The voltages $G_1$, $G_2$, $G_3$, $G_4$ are now applied to the four gate electrodes in succession to propagate the row of information to beneath electrode 46. Now the $\phi_{C1}$ voltage goes on and the information in channels 60, 64 and 67 shifts via the potential wells beneath the transfer electrodes 48a, 52a and 54a to the deeper potential wells beneath their paired storage electrodes 48b, 52b and 54b respectively.

Now the gate voltages $G_3$ and $G_2$ are turned on and concurrently the gate voltage $G_4$ is turned off to return the remaining information, that is, the charge signal in columns 62 and 65 to beneath electrode $G_2$. Now the gate voltages $G_3$ and $G_4$ may be removed and the charge remains stored beneath electrode $G_2$ as explained in more detail later. Now, with the switch 70 in the position shown, the $\phi_{C2}$ and $\phi_{C1}$ and $\phi_{C1-1}$ and $\phi_{C1-2}$ voltages, which are at the same frequency, are applied in two phase fashion to shift the contents of the C register into the C1 register 72.

After the C1 register 72 is loaded, the gate voltages $G_3$ and $G_4$ are turned on again to shift the remaining part of the row of information to beneath electrode $G_4$. During this period, the $\phi_{C2}$ voltage is on and the $\phi_{C1}$ voltage off so that this information shifts from columns 62 and 65 to beneath electrodes 50b and 53b. Now switch 70 is thrown to its other position, that is, in contact with terminal 85. Now the voltages $\phi_{C1}$ and $\phi_{C2}$ are applied to the C register while the voltages $\phi_{C1-1}$ and $\phi_{C1-2}$ are applied to the C1 register 72. As already mentioned, these voltages are at the same frequency and the phasing of these two voltages is such that first a packet of charge signal is removed from one register, such as the C register, and then a packet of charge signal is removed from the other register, the C1 register, and so on. When a packet of charge signal is available from the C register, the switch 78 is thrown to terminal 80 and when it is available from the C1 register, it is thrown to terminal 76. Thus, the two interleaved halves of the row read from the B register into the C and C1 registers become recombined and are stored in the C2 register. It is apparent, of course, that the C2 register must be clocked at a frequency double that employed for the C and C1 registers as the information at the input terminal of the C2 register is at twice the frequency of that supplied by the C register or the C1 register. Thus, the multiple phase voltages $\phi_{C2-1}$, $\phi_{C2-2}$ are at twice the frequency of the multiple phase voltages for the C register and the C1 register.

After the C2 register is loaded, its contents are transferred, in parallel, to the output register 84. This output register now may be read out by application of the multiple phase voltages $\phi_{CO-1}$, $\phi_{CO-2}$, which may be at the same frequency as the multiple phase voltages applied to the C and C1 registers or at any frequency which is suitable for the readout of video information. As soon as the readout of register 84 starts, the entire process just described may be repeated for the next row of information in the B register. This next row should now be under electrode 30. By the time the readout of register 84 starts, the C register has been emptied and the C1 and C2 registers also are empty.

Figure 5:
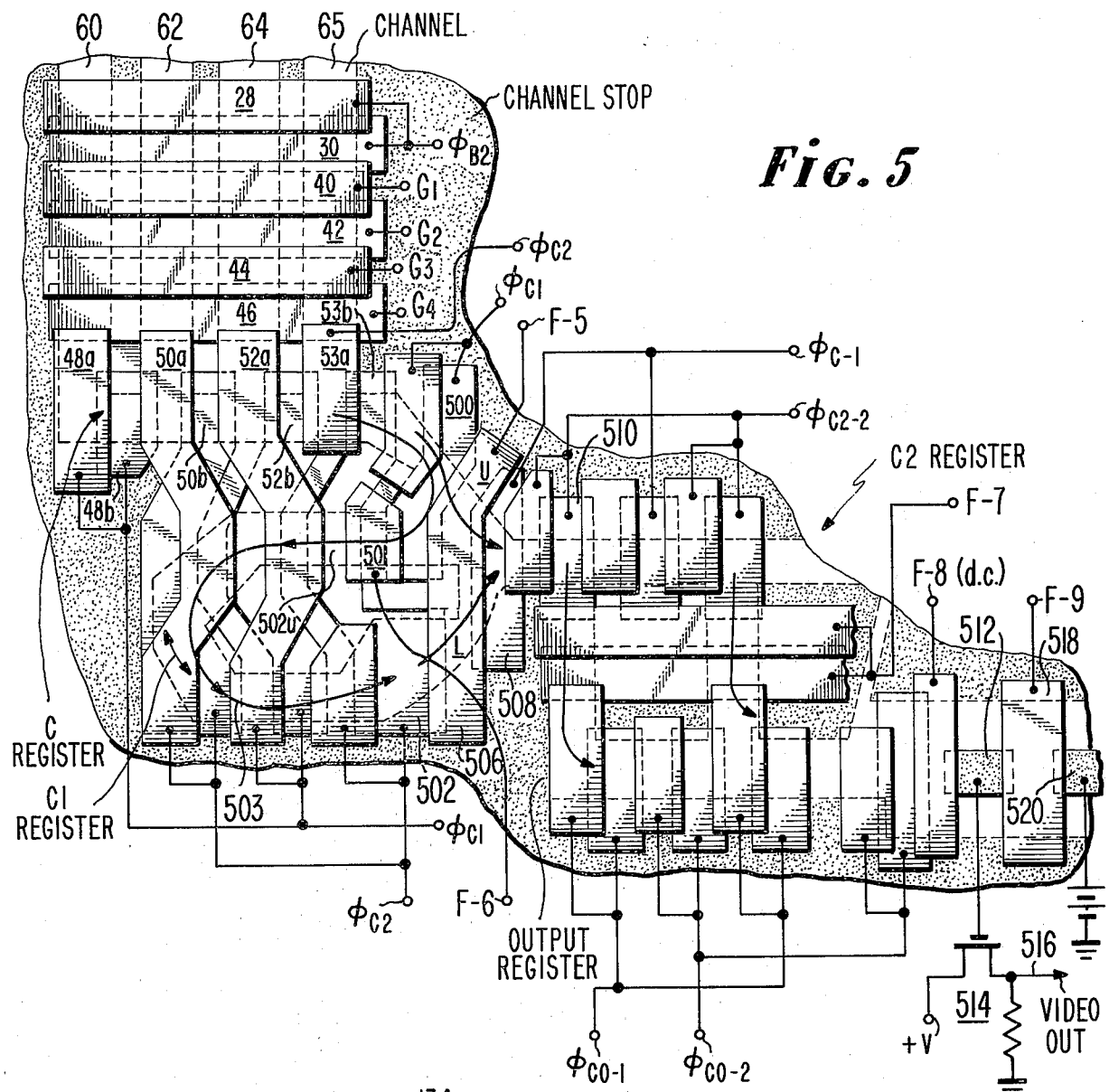
FIG. 5 is a more detailed showing of some of the structure of the arrangement of FIG. 4.

FIG. 5 is a more realistic showing of the system of FIG. 4. The operation may be better understood by referring to FIGS. 6, 7a and 7b. For purposes of explanation, the imager is assumed to have only four channels; however, it is to be understood that the principles are applicable to arrays having a much larger number of channels.

Figure 7A:
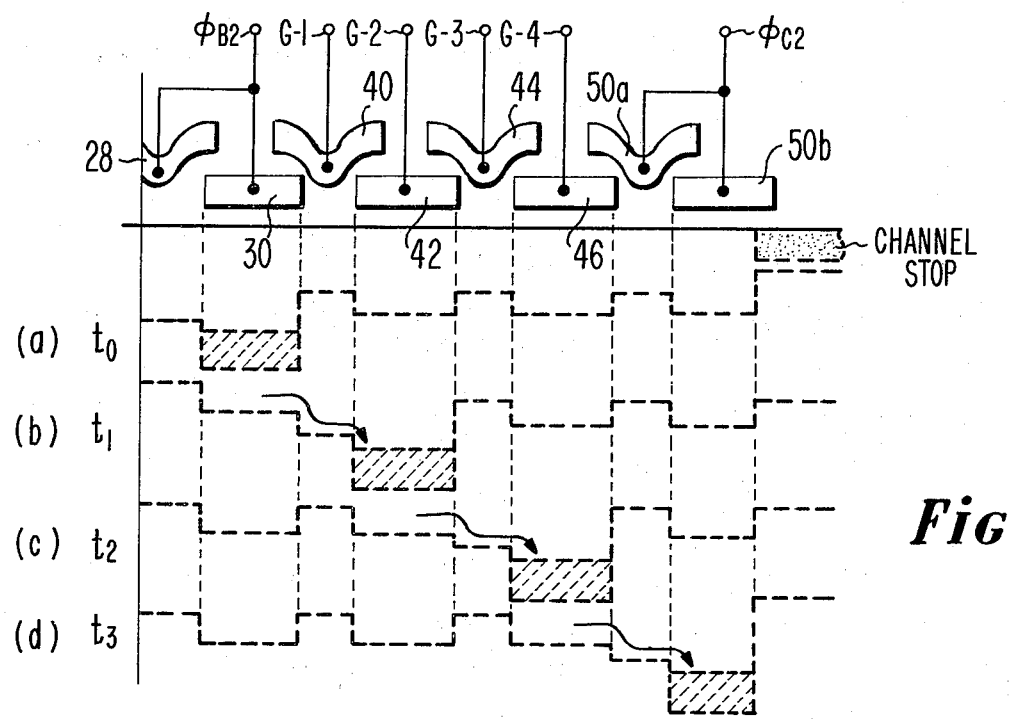
FIGS. 7a and 7b shows surface potential profiles obtained during the operation of the system of FIG. 5.

In operation, it may be assumed that at time $t_0$ the charge signals are stored beneath the last electrode 30 of the B register, as illustrated at a in FIG. 7a. At time $t_1$, the voltages G-1 and G-2 are high and the charge signal propagates to beneath electrode 42. At time $t_2$, the voltages G-3 and G-4 are high so that the charge signal propagates to beneath electrode 46. Note here that so called "drop-clock" operation of two-phase CDD's is assumed. That is, the substrate biasing is such that when a pulse such as G-2 terminates, the potential well beneath electrode 30 although reduced in size is still large enough to store a charge signal of the maximum desired value. Therefore, if a charge signal is stored beneath this electrode when G-2 terminates, this charge signal remains stored there. The following pulse G-3 starts after the pulse G-2 has terminated, that is, these two pulses do not overlap. However, because the pulse G-3 makes the well beneath electrode 44 deeper than the residual well beneath electrode 42, charge propagates from beneath electrode 42 to beneath electrode 44. Of course, as already mentioned, at time $t_2$ the pulse G-4 also is present and the electrode 46 to which it is applied is closer to the substrate than electrode 44 so that the charge propagated to beneath electrode 44 passes to beneath electrode 46.

Figure 6:
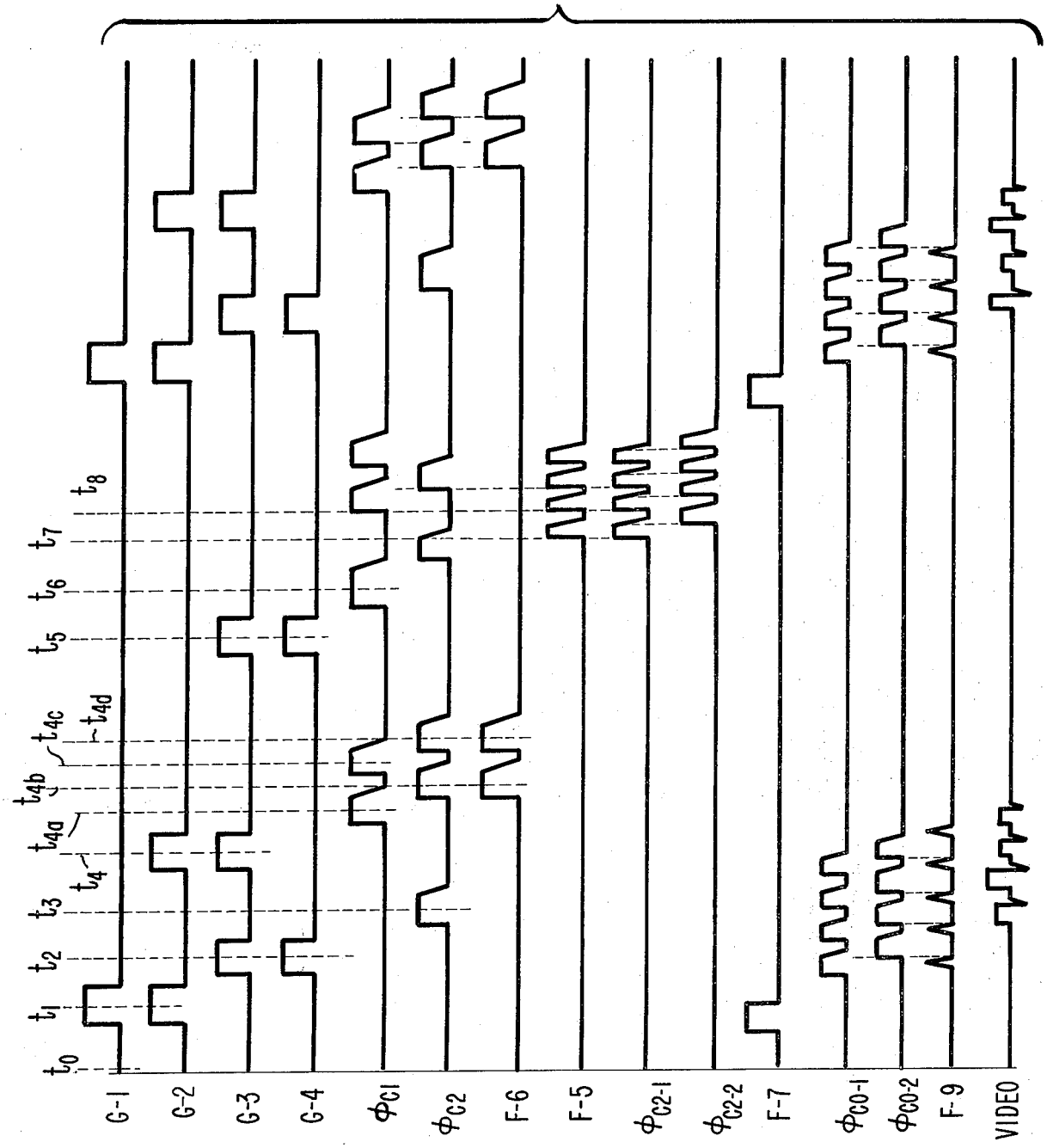
FIG. 6 is a drawing of waveforms to help explain the operation of the system in FIG. 5.

FIGS. 6 and 7a should now be referred to. FIG. 7a shows what occurs in a channel leading to a $\phi_{C2}$ electrode in the C register, such as channel 62 which leads to $\phi_{C2}$ electrode pair 50a, 50b. At time $t_3$, the $\phi_{C2}$ pulse occurs and this causes the transfer of charge from beneath electrode 46 to beneath electrode 50b.

Figure 7B:
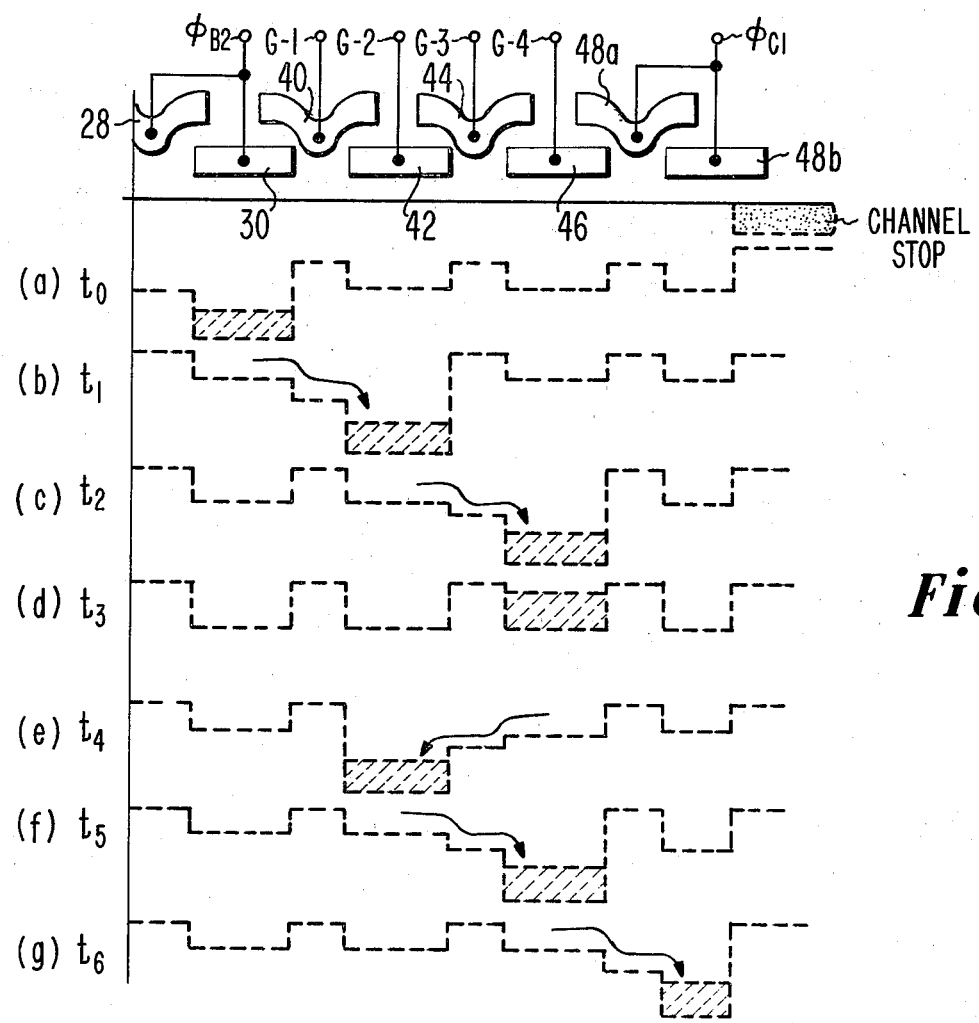

Turning now to FIG. 7b which shows what occurs in a channel leading to a $\phi_{C1}$ electrode in the C register, at time $t_3$ the $\phi_{C1}$ pulse is not present. Accordingly, there is a potential barrier beneath electrode 48a and the charge stored beneath electrode 46 in channel 60 remains stored beneath electrode 46. This is shown at $d$ in FIG. 7b. At time $t_4$, the pulses G-2 and G-3 occur. This causes the charge in channel 60 beneath electrode 46 to return to beneath electrode 42 as indicated at $e$ in FIG. 7b.

Recapitulating for a moment, at time $t_4$, one half of a row of charge signals is stored beneath the $\phi_{C2}$ electrodes of the C register and the other half of the row of information is stored beneath electrode 42.

At time $t_{4a}$ (FIG. 6) the pulse $\phi_{C1}$ occurs and this propagates the charge signals stored beneath electrode 53b to beneath electrode 500. At time $t_{4b}$, the first pulse F-6 is present concurrently with the $\phi_{C2}$ pulse and this propagates the charge signal from beneath electrode 500 to beneath the portion 502a of electrode 502 via the substrate region beneath electrode 501.

At times $t_{4c}$ and $t_{4d}$, the process above of transferring charge from register C to register C1 is repeated so that the two charge signals formerly stored in the C register are now half-way down the C1 register in the direction indicated by the arrows 503.

At time $t_5$ the pulses G-3 and G-4 occur again. These propagate the second half line from beneath the gate electrode 42 to beneath gate electrode 46. This is shown in FIG. 7b at $f$. At time $t_6$ when the pulse $\phi_{C1}$ is present, the charge signal has moved from beneath electrode 46 to the $\phi_{C1}$ electrodes 48b and 52b respectively (see $g$, FIG. 7b). This $\phi_1$ pulse also moves the charge signal in the C1 register along the path of that register. The following $\phi_{C2}$ pulse at time $t_7$ moves the information in the C1 register further along the path of the C1 register.

Now the reconstruction or reformatting of the two interleaved lines, one stored in the C register and the other in the C1 register, begins to occur. As may be observed in FIG. 6, at time $t_7$ the first F-5 pulse occurs. There is no F-6 pulse present. Accordingly, the information from the C register will not pass into the C1 register. Now each time a F-6 pulse occurs, either a charge packet from the C1 register or a charge packet from the C register will pass into the C2 register. The first F-5 pulse starts while the last $\phi_{C2}$ pulse is terminating. Here the conventional "push-clock" mode of operation is being employed; however, "drop clock" operation could be used instead, if desired. At time $t_7$ when the first F-5 pulse occurs, charge signal is present beneath electrode 502 in the C1 register. This charge signal therefore propagates to beneath electrode 506, region L, to beneath electrode 508. The $\phi_{C2\text{-}2}$ pulse starts while the $\phi_{C2\text{-}1}$ pulse is terminating (again, push-clock operation). This propagates this charge signal to the electrode 510.

F-5 goes high again at time $t_8$. At the same time $\phi_{C1}$ is high. When $\phi_{C1}$ goes high, charge signals in the C register move to beneath electrode 500. This same charge signal moves to beneath electrode 506 region U as F-5 so that this same charge signal propagates to beneath electrode 508.

The process described above continues until the C2 register is filled. Note that the F-5 pulses, when present, are at twice the frequency of the F-6 pulses as are the $\phi_{C2\text{-}1}$ and $\phi_{C2\text{-}2}$ pulses.

After the C2 register is filled, the F-7 pulse occurs. This transfers the contents of the C2 register to the output register. The $\phi_{CO\text{-}1}$ and $\phi_{CO\text{-}2}$ pulses may now be applied to transfer the signals to the output floating diffusion 512. Each time a charge packet arrives at 512, the N-type MOS transistor 514, which is operated as a source follower, is turned on. This causes a video signal to be produced at output lead 516. Just before each charge signal is received at 512, pulse F-9 is applied to electrode 518 to reset the floating diffusion 512 to the potential of the drain diffusion 520. This process is discussed at greater length later in connection with FIG. 8.

The use of a single transistor is intended to represent the output structure. In practice, an inverter may be employed and a transmission gate may also be employed in series with output lead 516, this transmission gate being gated on for only short periods during the presence of charge to reduce clock induced noise. Also, while not shown, it is to be understood that means may be provided for eliminating serrations in the video output pulse train.

Figure 8:
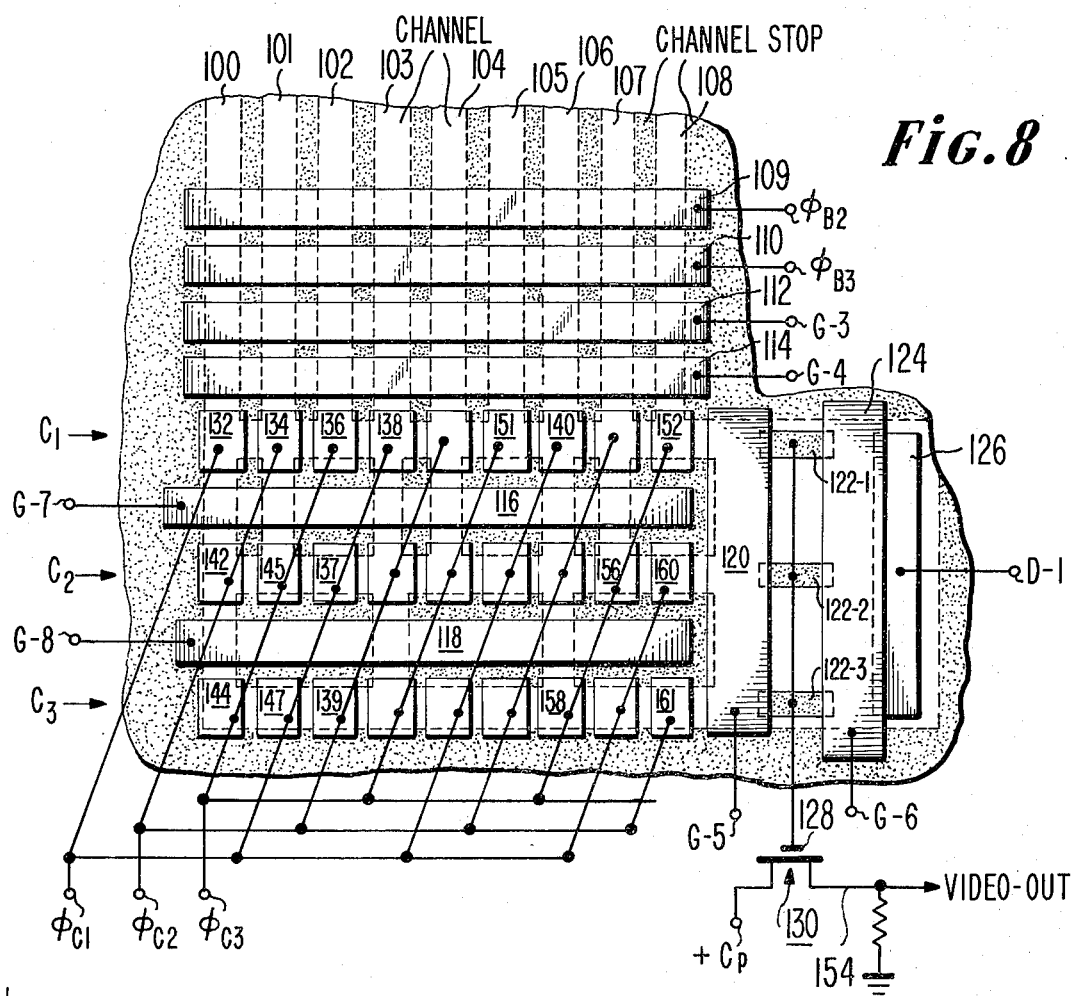
FIG. 8 is a plan view of a portion of another CCD imager embodying a second form of the invention.

FIG. 8 illustrates another embodiment of the invention suitable for a three phase operation. The same general principles, however, are applicable to the construction of a high resolution frame transfer imager formed of two-phase CCD's. The electrodes, which may be metal or polysilicon, are shown to be spaced from one another. In practice, employing a single polysilicon deposition step for all electrodes, the spacing between them is in the form of undoped polysilicon may be comparable to that of the doped polysilicon regions representing the electrodes. In an alternative form of construction, sometimes known as "triple poly," three separate steps are employed to lay down the electrodes and here the electrodes overlap one another.

For purposes of illustration, the system is shown to have nine channels 100–108 spaced by channel stop diffusions. Two electrodes 109, 110 of the three electrodes making up the last row of the B register, are illustrated. Two gate electrodes 112 and 114 follow electrode 110.

The C register comprises three sections $C_1$, $C_2$, $C_3$, one electrode in each section being aligned with one of the channels. A gate electrode 116 is located between the $C_1$ and $C_2$ sections of the output register and a second gate electrode 118 is located between the $C_2$ and $C_3$ sections of the register. The output circuit of the C register includes a gate electrode 120, three floating diffusions 122-1, 122-2 and 122-3, a second gate electrode 124, and a drain diffusion 126. The floating diffusion connects to the gate electrode 128 of an N type MOS transistor 130.

The operation of the system of FIG. 8 may be better understood by referring to FIGS. 9–12. It is apparent from FIG. 9 that a P type substrate (N channel) is assumed and it is also assumed that the CCD is one of the surface channel type. It is to be understood, of course, that here and in FIGS. 4–7, and the remaining FIGURES, the concepts discussed are equally applicable to surface channel CCD's having N type substrates, and to buried channel CCD's of either type substrate.

Figure 9:
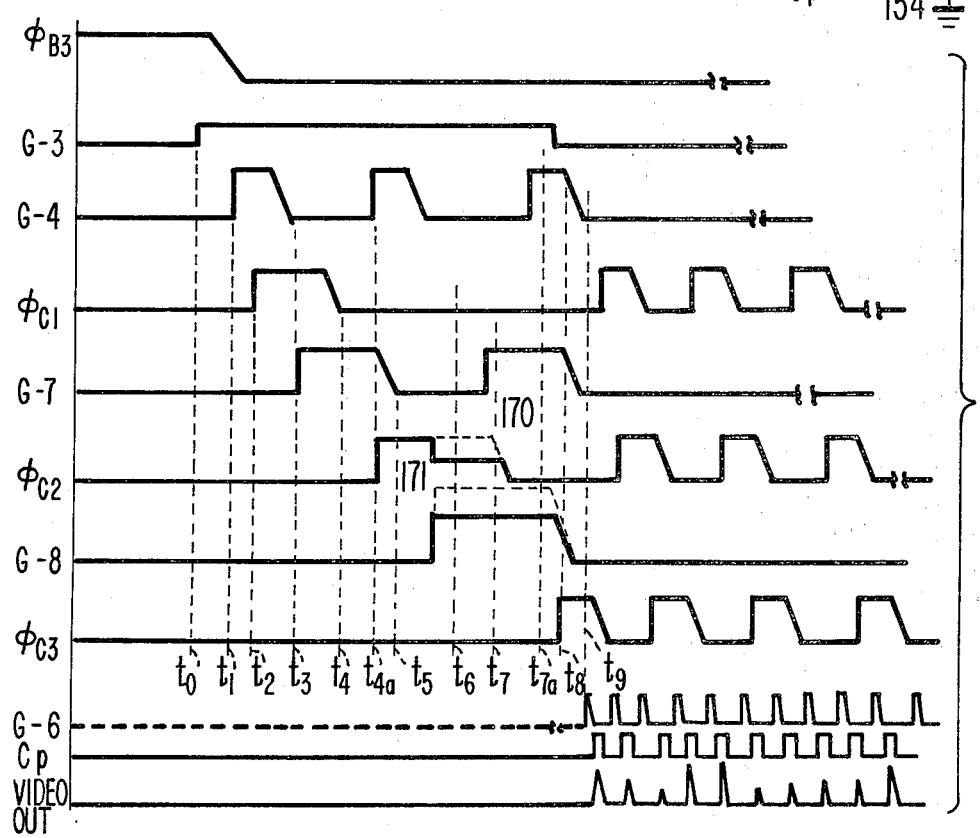
FIG. 9 is a drawing of waveforms to explain the operation of the system of FIG. 8.
Figure 10:
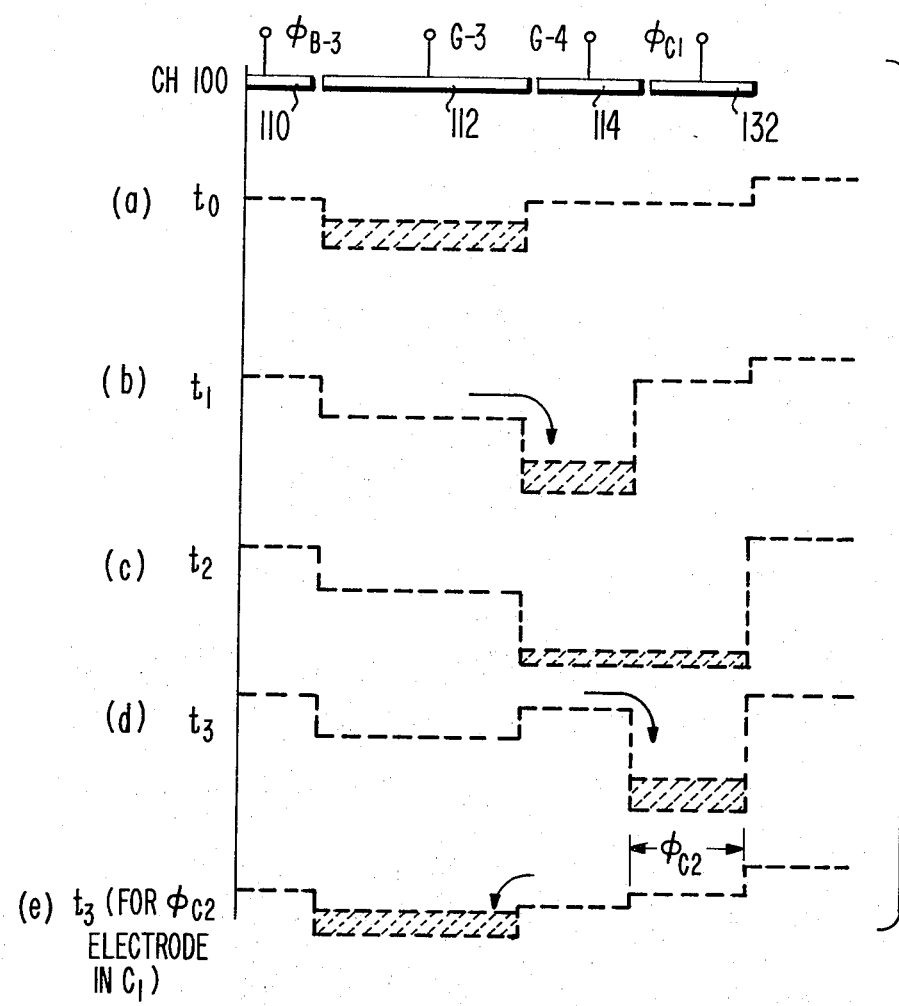
FIGS. 10 – 13 are drawings of surface potential profiles obtained during the operation of the system of FIG. 8.

Referring to FIGS. 8 and 9, in response to the multiple phase voltage $\phi_{B3}$ at a relatively positive level, a row of minority carrier charge signals (electrons) accumulate beneath electrode 110. At time $t_0$ when G-3 goes positive, charge signals propagate to beneath electrode 112, as indicated in FIG. 10 at $a$. At time $t_1$, the voltage G-4 goes positive to a greater extent then G-3 so that the charge signal formerly beneath electrode G-3 becomes stored beneath electrode G-4, as indicated in FIG. 10 at $b$. (Note that electrode 112 for the G-3 signal is wider than the electrodes 109, 110 and 114 so that even though it is held at a lower voltage level G-3 than the other electrodes it has substantially the same storage capacity.) At time $t_2$ while the voltage G-4 is still high, $\phi_{C1}$ has become high and at time $t_3$, G-4 is going low. Assuming that the $\phi_{C1}$ electrode illustrated in FIG. 10 is electrode 132, the charge signal formerly present under electrode 114 and in channel 100 spills, in part, into the potential well beneath electrode 132, as indicated at $c$ in FIG. 10 and then, when G-4 goes low at time $t_3$, this charge signal spills entirely into the potential well beneath electrode 132.

Electrodes such as 134 and 136 in register section C1 are at a relatively low potential during the times discussed above so that no charge propagates to beneath these electrodes. FIG. 10 illustrates at $e$ what occurs at time $t_3$, for an electrode such as 134 which is driven by $\phi_{C2}$. At time $t_3$, when the voltage G-4 is going low, the charge formerly present which was stored beneath electrode 114 flows back to beneath electrode 112. Thus, at the completion of the operation just described, all of the electrodes in the C1 section which are driven by the first phase $\phi_{C1}$ have become loaded, and the remainder of the charge signal has been propagated back toward the potential wells beneath electrode 112. Thus the potential wells beneath electrodes 132, 138 and 140 are storing charge signals.

Figure 11:
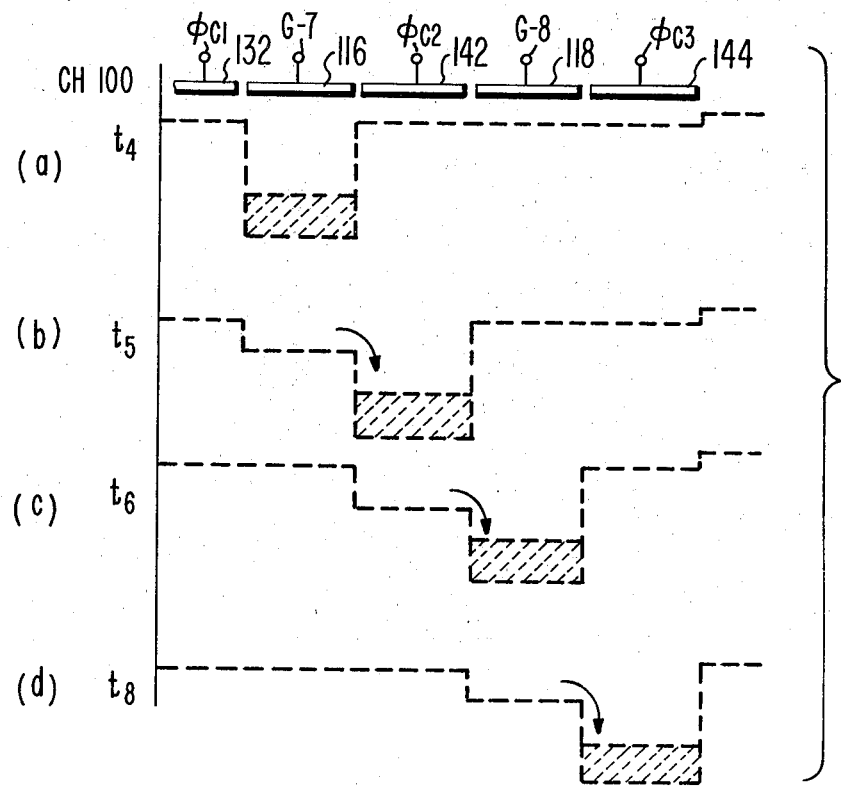

FIGS. 9 and 11 illustrate what occurs during following time intervals. At time $t_4$, $\phi_{C1}$ is low and G-7 is high. To simplify the explanation which follows, only one of the columns will be referred to, it being understood that the same thing occurs in every column where the same conditions exist. Thus, what occurs in column 100 will also occur in columns 103 and 106, as an example.

Returning to the explanation, at time $t_4$, a high signal G-7 is applied to electrode 116 and this electrode is storing the charge signal of channel 100 which was transferred from beneath electrode 132. This is shown in FIG. 11 at $a$. At time $t_5$, the voltage G-7 is going low and the voltage $\phi_{C2}$ is high so that charge transfers from beneath electrode G-7 in column 100 to beneath electrode 142 of register section C$_2$. At time $t_6$, the $\phi_{C2}$ voltage (solid line) goes somewhat less positive and the voltage G-8 is applied to electrode 118 in channel 100. Thus, the charge in channel 100 moves to beneath electrode 118 and shown at $c$ in FIG. 11. At time $t_8$, the voltage $\phi_{C3}$ goes positive and the voltage G-8 goes less positive so that the charge signal formerly present beneath electrode 118 in channel 100 propagates to electrode 114 as shown at $d$ in FIG. 11.

Figure 12:
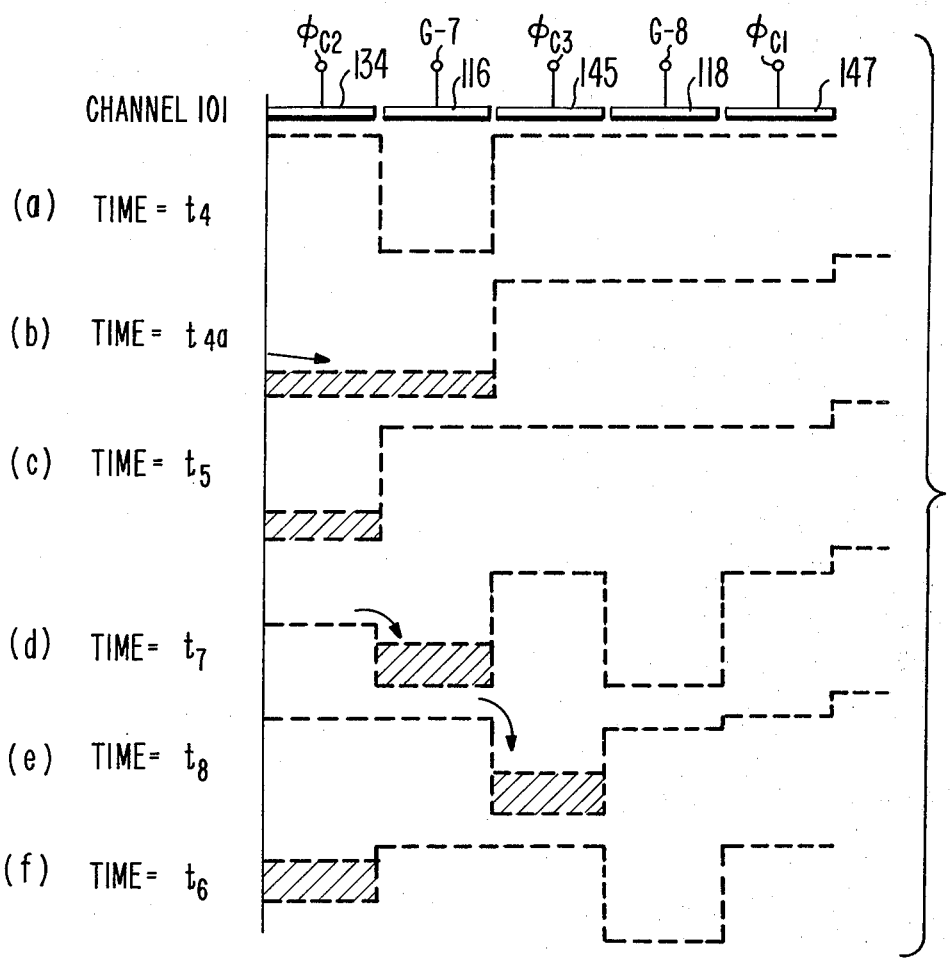

FIG. 12 illustrates what is occurring in channel 101 during the times discussed above. At time $t_4$ the voltage G-7 is positive and there is a potential well present beneath electrode 116. However, no charge is present in this potential well because there was no charge present beneath electrode 134 of channel 101. At time $t_{4a}$ while G-7 is still positive, the voltage G-4 is positive and the voltage $\phi_{C-2}$ goes positive. Accordingly, charge propagates from beneath electrode 114 to the potential wells beneath electrodes 134 and 116 of channel 101. This is shown in FIG. 12 at $b$.

At time $t_5$, the voltage G-7 returns to its quiescent value while $\phi_{C2}$ is positive. Accordingly, the charge formerly present beneath electrodes 134 and 116 of channel 101 now moves back up channel 101 and accumulates beneath electrode 134 of the C$_1$ register section and also beneath electrode 114. At time $t_6$, G-4 goes low so all of the charge now is beneath electrode 134. At time $t_7$ when $\phi_{C2}$ is reduced somewhat in value and the voltage G-7 is maximum positive, the charge signal in channel 101 propagates from beneath electrode 134 to beneath electrode 116. At time $t_8$ when the voltage G-8 is returning to its original value and while $\phi_{C3}$ is high and $\phi_{C2}$ low, and while the voltage G-7 is returning to its quiescent value, the charge formerly present beneath electrode 116 in channel 101 now propagates to beneath electrode 145 in register section C$_2$. This last step is illustrated at $e$ in FIG. 12.

Figure 13:
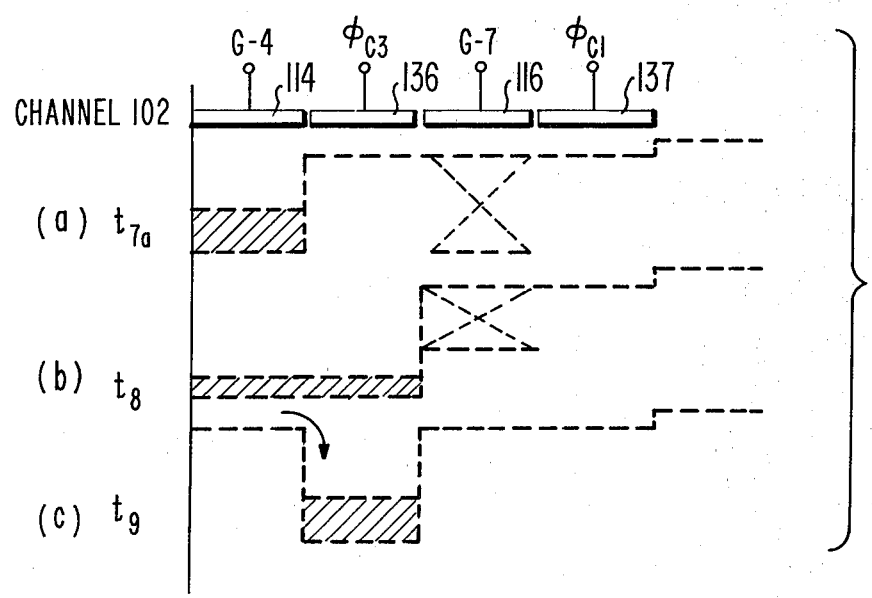

Recapitulating what has occurred to this point, at time $t_8$ the information in channel 100 is residing beneath electrode 144 in the C$_3$ register section. At this same time, the information in channel 101 is residing beneath electrode 145 in the C$_2$ register section. It also may be seen, with the help of FIG. 13, that the information in channel 102 is residing, in part, beneath electrode 114 and in part beneath electrode 136 in the C1 section of the register. (The dashed X's in FIG. 13 indicate that a channel stop diffusion is present in channel 102 beneath electrode 116 so the voltage of this electrode has no effect on the propagation of charge beyond electrode 136.) A short time later at $t_9$ this information has transferred in its entirety to beneath electrode 136. The C register is now completely loaded. The $\phi_{C3}$ electrodes in section C$_1$, that is, 136, 151 and 152 are storing charge; the $\phi_{C2}$ electrodes are storing charge in register section C2; and the $\phi_{C3}$ electrodes are storing charge in register section C3.

The construction of the C register is of some interest. Channel 100 extends through all three register sections. In channel 101, there is a channel stop diffusion between electrode 145 in the C$_2$ section and electrode 147 in the C3 section. In channel 102, as already mentioned, there is a channel stop between electrode 136 of the C1 section and electrode 137 in the C2 section and electrode 139 in the C3 section. These channel stops aid in insuring that charge packets will end up at the correct locations.

Output gate electrode 120 may be at a positive potential (at a d.c. bus level) to create a surface potential between the register sections and the floating diffusions 122. Now when the $\phi_{C3}$, $\phi_{C1}$ and $\phi_{C2}$ pulses occur, charges pass to the floating diffusions. For example, when $\phi_{C3}$ occurs, charge is stored beneath electrode 152. When $\phi_{C3}$ goes off, that is, during the lagging edge of this pulse, the charge present beneath electrode 152 passes beneath electrode 120 to the floating diffusion 122-1. Note that the surface potential beneath electrode 120 is such that when a pulse such as $\phi_{C3}$ is present, it prevents charge from passing from the potential well beneath electrode 152 to floating diffusion 122-1; however, as the pulse terminates and the surface potential beneath electrode 152 reduces, the charge does pass beneath 120 to floating diffusion 122-1.

During a time beginning somewhat after $t_9$, the clock pulses $Cp$ may be applied to the drain electrode of transistor 130 to sense the voltage present at the floating diffusions. When the first such clock pulse occurs, the charge which has propagated to floating diffusion 122-1, and which results in a voltage at the gate electrode of output transistor 128, causes a video signal proportional in amplitude to this voltage, to appear at the source electrode 154 of this transistor. The $\phi_{C3}$ voltage applied to electrode 152 at this time is applied also to electrodes 156 and 158 to step the charge in register sections C2 and C3 to beneath these electrodes.

After the video signal has been sensed, the voltage G-6 goes high and the drain diffusion 126 resets all floating diffusions 122 to a reference level D-1. (These diffusions are made separate to reduce capacitance.) This may be a relatively positive voltage level. (The positive pulses G-6 are at the same frequency as the clock pulse C$p$.)

A short time later, the phase $\phi_{C1}$ goes high and the charge formerly present beneath electrode 156 passes to beneath electrode 160. When $\phi_{C1}$ terminates, that is, during the lagging edge of this voltage pulse the charge signal passes from beneath electrode 160 via the substrate surface beneath electrode 120 to the floating diffusion 122-2. Again the voltage produced in response to this charge activates transistor 130 when the next clock pulse C$p$ arrives and causes the next video signal to be produced. A short time later, another positive pulse G-6 occurs and floating diffusions 122 are reset to the voltage level D-1.

The process described above continues until all three register sections are read out. Charges flow from the register sections in succession so that the three interleaved parts of the row are recombined during the readout process to reconstruct the row of information, that is, to produce output signals in the same format in which they initially were stored beneath the output electrode 110 of the B register.

Returning for a moment to FIG. 9, it may be observed that the voltage $\phi_{C2}$ which is most positive at a time such as $t_5$ drops to a lower positive level immediately before time $t_6$. The reason is to transfer the charge beneath an electrode such as 142 temporarily to beneath the electrode 118. As the charge is stored beneath electrode 118 then a short time later, when the voltage G-7 goes high (the time $t_7$) this charge cannot be propagated to beneath electrode G-7. Thus, this charge (beneath electrode G-8 in channel 100) at a still later time $t_8$ can propagate to beneath electrode 144. The same result can be achieved by employing waveforms such as depicted by the dotted lines 170 and 171 in FIG. 9. The dotted line 170 indicates that $\phi_{C2}$ remains at the same relatively high positive level; however, the voltage G-8 goes to a higher positive level to temporarily store the charge in a channel such as 100 beneath electrode 118.

Figure 14:
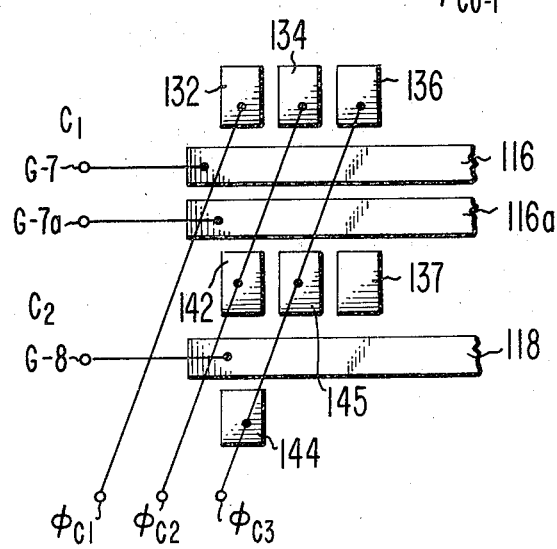
FIG. 14 is a schematic showing of a portion of a modified form of the system of the FIG. 8.

The same effect can be achieved with a modified structure such as shown, in part, in FIG. 14. This modified structure includes an electrode 116$a$ between electrode 116 and register section C2. With the additional electrode 116$a$, the transfer of the signal from channel 101 to the potential well under the electrode 145 can be accomplished by conventional push clocks, that is, overlapping clocks with relatively slow fall times. In this case, during the transfer of the signal in channel 100 from beneath electrode 142 to beneath electrode 118 during the G-8 pulse, the signal from channel 101 is transferred from beneath electrode 134 to a well beneath electrode 116 formed by pulse G-7. At this time electrode 116$a$ acts as a barrier to prevent the flow of charge from beneath electrode 142 back toward electrode 116. Later G-7$a$ goes high and by normal push clock operation the charge in channel 101 transfers to beneath electrode 116$a$. Then when $\phi_{C3}$ goes high and G-7$a$ goes low, the charge transfers from beneath 116$a$ to beneath 145 and from beneath electrode 118 in channel 100 to beneath 144.

Figure 15:
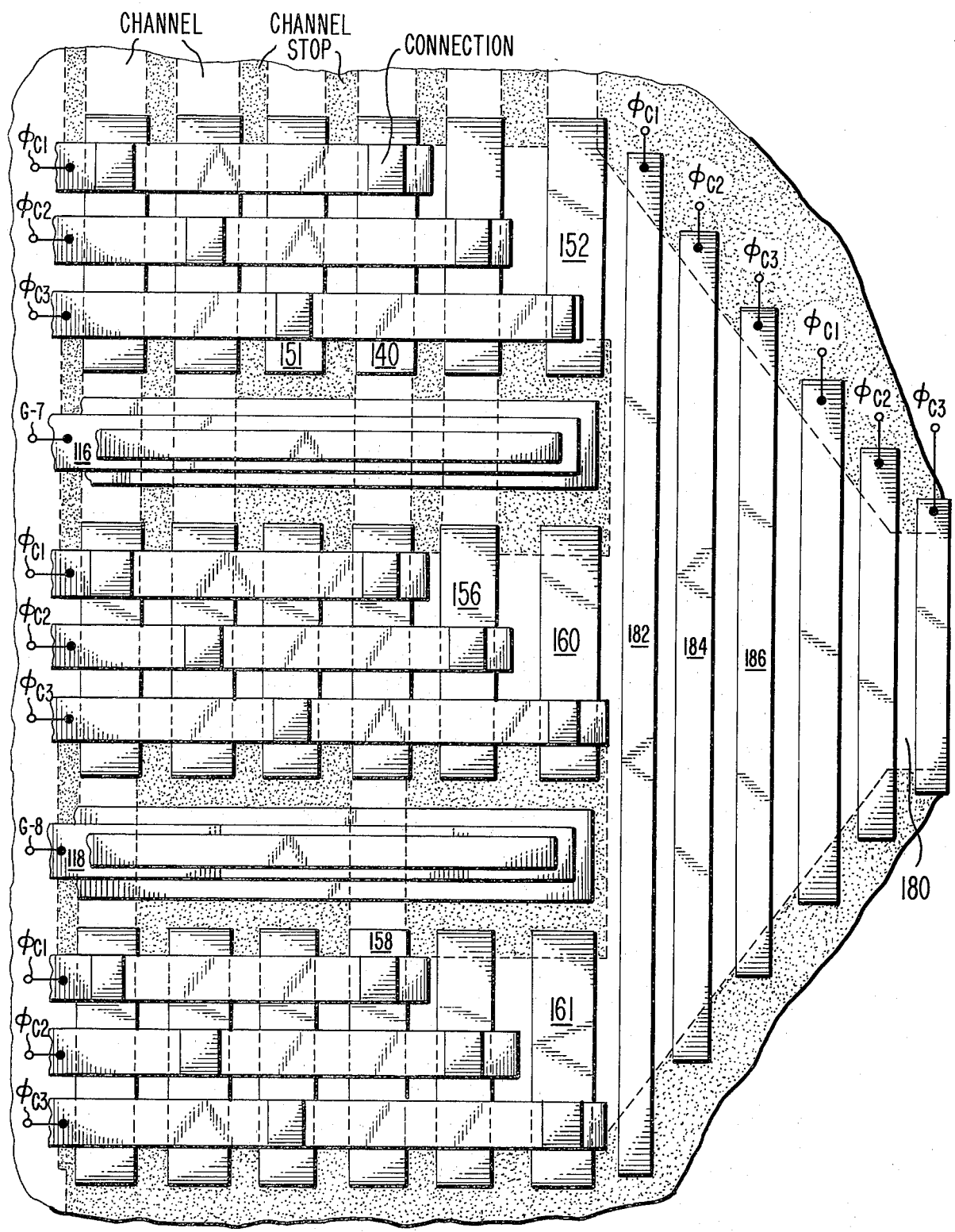
FIG. 15 is a plan view showing the system of FIG. 8 somewhat more realistically and having a modified form of output structure.

FIG. 15 shows, in part, the three output registers corresponding to C1, C2 and C3 in FIG. 8 but with a modified output structure. In the arrangement of FIG. 15 the three channels converge to a single channel 180 and a plurality of three-phase electrodes, such as 182, 184 and 186, are employed to propagate each charge packet via the converging channel to the output channel 180.

Figure 19:
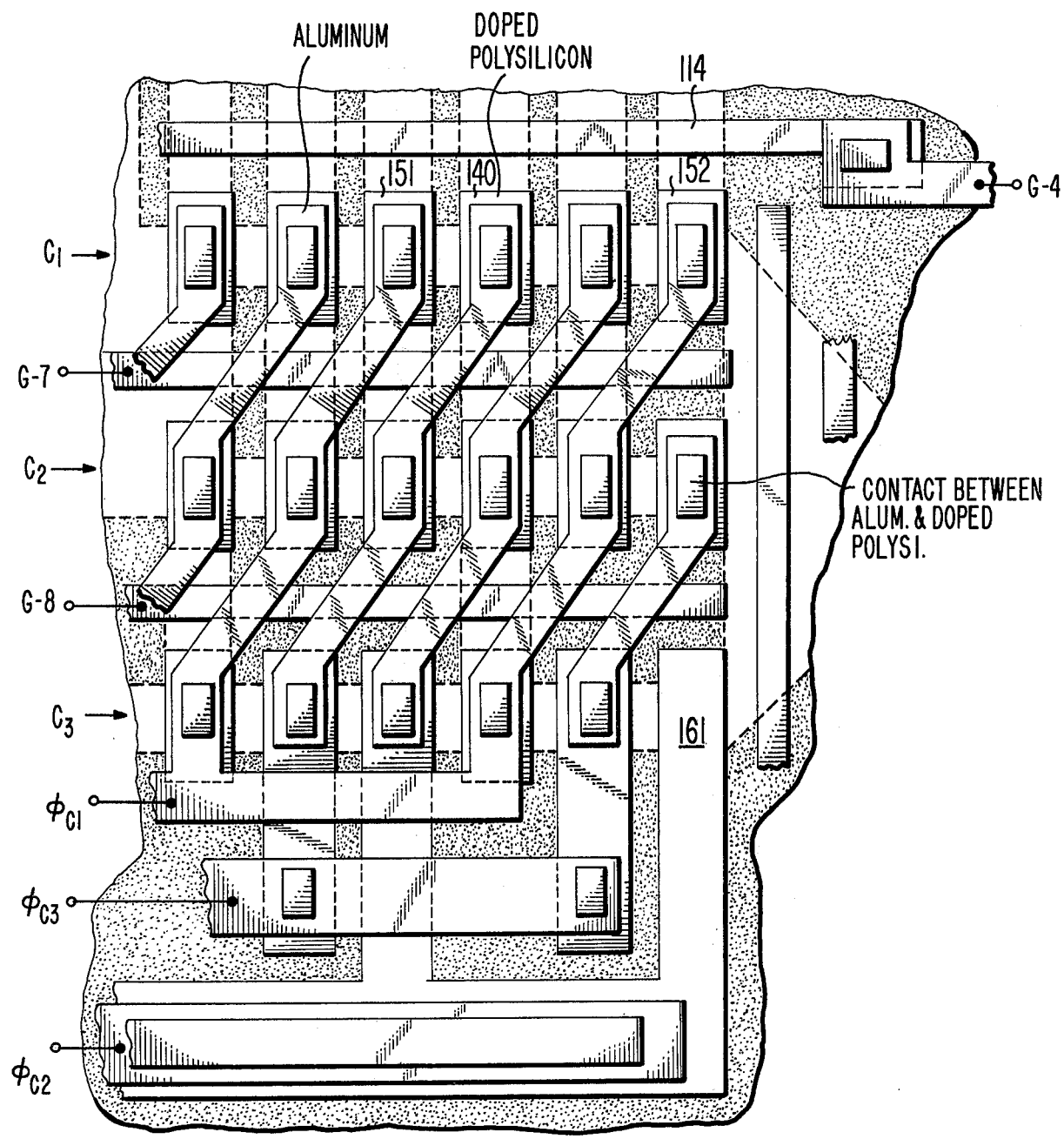
FIG. 19 is a plan view of a modified system such as shown in FIG., 8, made using single layer polysilicon construction.

FIG. 19 shows a modified construction for the arrangement of FIG. 15. The arrangement of FIG. 19 comprises a so called single layer polysilicon CCD where a layer of polysilicon is doped to define the electrodes and remains undoped in the regions between electrodes. Contact is made to the electrodes by aluminum conductors topologically arranged, as shown. Except in the areas indicated by the crosses within rectangles, the aluminum is insulated from the doped polysilicon by a material such as silicon dioxide.

Another form of construction of the three-phase system illustrated in FIG. 8 employs a separate level of polysilicon for each phase voltage. An advantage of this type of high density construction is that the shorts between the polysilicon at the same level represent shorts between gates driven by the same phase voltage. The gates 116 and 118, separating the output registers C1, C2 and C3, may be formed as a first level of polysilicon. The gates driven by the three phase voltages are formed of three additional levels of polysilicon. This makes a total of four levels of polysilicon.

The high resolution imager employing parallel output registers, illustrated in FIG. 8 for the case of a three-phase system, can, of course, be made instead for two-phase, four-phase or other multiphase operation. In a two phase system, for example, an additional level of polysilicon may be employed for a gate such as 116 in FIG. 8 which separates the two output registers C1 and C2. In this case the imager employs a first level of polysilicon for the gate 116, a second level of polysilicon for the storage gates, and a third level of polysilicon for the transfer gates. An additional level of metalization, for the interconnection, may be in the form of aluminum.

In the above and in the other imagers described herein, means (not shown) may be provided for introducing so called "fat zero" charge signals for surface channel embodiments of the invention. This may be done optically by using a uniform, low level light source or electrically. The electrical means may include a source region at the upper edge (FIG. 1) of the A register, and gate electrode means for clocking into the channels of the register, in parallel, charge signals at the fat zero level.

Figure 16:
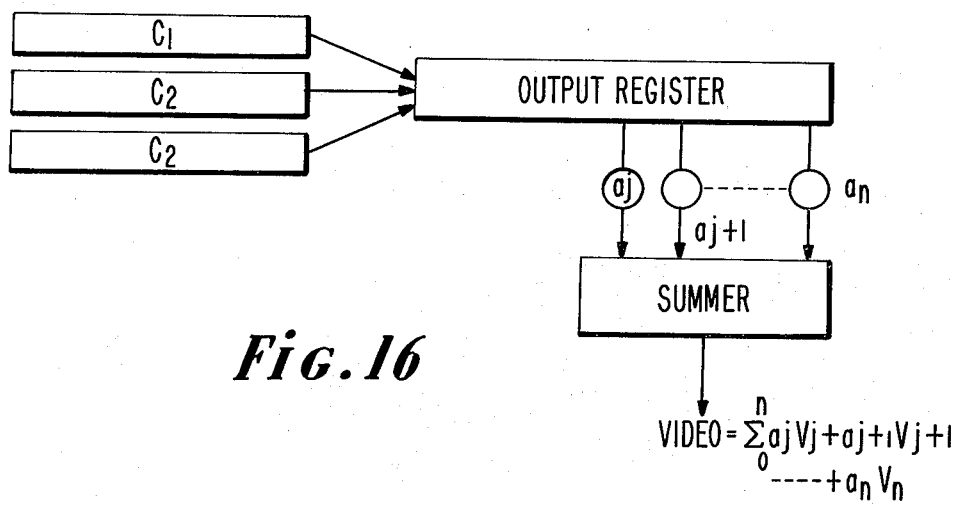
FIG. 16 is a block diagram showing how some "on chip" video processing may be performed in any one of the systems illustrated.
Figure 17:
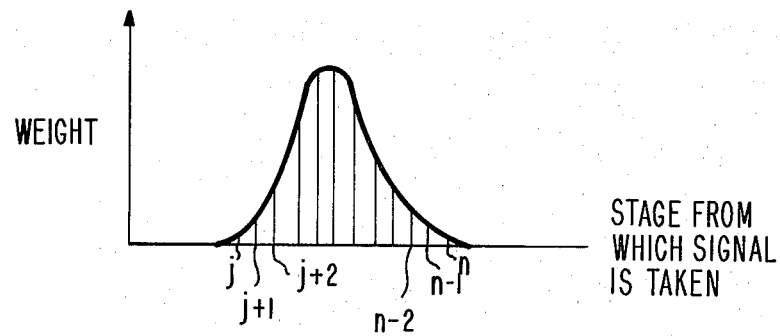
FIG. 17 shows schematically one form of optical aperture which may be simulated with the arrangement of FIG. 16.

With various structures discussed above, it is relatively simple to perform some "on-the-chip" signal processing. For example, as illustrated in FIG. 16, the output charge signal in a group of stages of the output register may be weighted by weights $a_j \ldots a_n$ to simulate a horizontal photosensing aperture of desired shape. With proper choice of weights, a Gaussian distribution may be obtained, as illustrated in FIG. 17, or other forms of aperture, such as sin 4/4 or rectangularly shaped or other shaped apertures may be produced.

Figure 18:
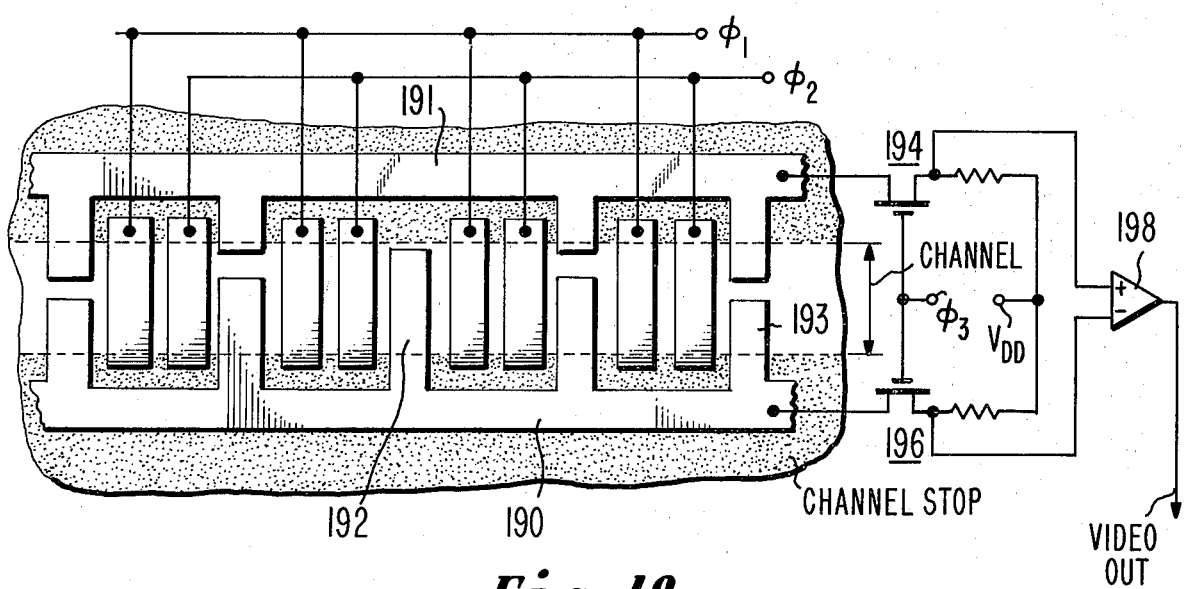
FIG. 18 is a plan view of a circuit for weighing different output signals, as desired.

FIG. 18 shows a structure for performing the weighting. Here the $\phi_3$ electrode structure comprises two parts 190 and 191. At each location the electrode 190, for example, extends into the channel an amount proportional to the weighting desired. The elctrode portion 192, which extends across the entire channel, will simulate a weight substantially greater than that of the electrode portion 193. The two electrode sections connect to the respective drain electrodes of two source followers 194 and 196 respectively. The $\phi_3$ voltage is applied to the drain electrodes of the transistors. The source electrodes of these stages connect to the input terminals of a differential amplifier 198. Other forms of weighting circuits are, of course, possible.

In the limiting case of aperture simulation, that is, employing only two output leads, each with equal weight, horizontal interlacing may be simulated. In previous horizontal interlacing arrangements, alternate columns of the B register are read during one field and the remaining alternate columns during the other fields. In the present arrangement, all of the columns may be read during each field and horizontal interlacing simulated by summing the output of two adjacent register stages (M and M-1 for an M stage register) during each field.

What is claimed is:

1. In a charge coupled imager having A and B registers with M channels extending in the column direction, and a C register which includes M charge storage sites generally aligned with said M channels, respectively, said register operated by a N phase voltage, the improvement comprising:

means coupling each channel of the B register to a different storage site in said C register, said means including during one portion of a row time, means for shifting 1/N'th of a row of charge signals into 1/N'th of said storage sites in said C register and during each following portion of the same row time, means for shifting 1/N'th of the remaining charge signals of said row into a different 1/N'th of said storage sites in said C register, until N/N parts of the row have been transferred;

means for reading out said C register comprising means for reading from the C register the one of the charge signals transferred from one of the 1/N'th parts of the row which is the first in position in that 1/N'th of a row followed by the first in position of the charge signals transferred from another 1/N'th part of the row, and so on until all N of the first in position charge signals have been read out, and for continuing the same process for the second through the M/N'th in position charge signals, until all NM/N = M charge signals have been read from the C register, whereby the row of charge signals read from the B to the C register is reconstructed during the readout of the C register; and said means for shifting including electrode means between the last row of the B register and the C register, said electrode means comprising storage electrode means for temporarily storing the entire row of charge signals, and transfer electrode means for transferring during spaced time intervals, 1/N'th of said row from said storage electrode means to said C register and for providing a potential barrier between the remaining charge, if any, stored beneath said storage electrode means and said C register during the periods between said spaced time intervals.

2. In a charge coupled imager as set forth in claim 1, where N = 2 and M is an even integer, said C register comprising:

a first section having only M/2 stages, each half stage of said first register being coupled to a different channel;

a second section also having M/2 stages;

means for shifting the contents of the first section to the second section serial fashion, after the first half row of charge signals has been transferred from the B register to the first section, and during a period of substantially one half of a field time;

a third section having M stages; and means for shifting in serial, interleaved fashion, during one half field time, after the second half row of charge signals has been transferred from the B register to the first section, the contents of the first and second sections into the third section.

3. In a charge coupled imager as set forth in claim 1; wherein said C register comprises N sections, each having only M/N stages; and wherein said means coupling each channel of the B register stage to a different C register stage comprises means for transferring, in parallel, 1/N'th of the row to the first section, 1/N'th of the remaining charge signals in the row interleaved with the first N'th of the row to the next section and so on until N/N'ths of the row have been transferred to the N sections, respectively.

4. In a charge coupled imager as set forth in claim 3, said means for shifting further including means for applying to each N'th electrode of said first register section one of the N phase voltages for transferring 1/N'th of the row of signals stored at said storage electrode means to said first register section via said transfer electrode means; means for reducing the voltage applied to said transfer electrode means for returning the remaining N-1/N'th of the row of charge signals to the storage electrode means; means for transferring, in parallel, the charge signals in the first register section to the second register section; means for increasing the voltage applied to said transfer electrode means; means for applying to each next N'th electrode of said first register section the next of the N phase voltages while removing the one of said N phase voltages, for transferring the second N'th of the row of signals stored at said storage electrode means to said first register section via said transfer electrode means.

5. In a charge-coupled imager as set forth in claim 3, further including, between each pair of adjacent sections of said C register, a gate electrode means for controlling the transfer of charge between said adjacent sections during one time period and for providing a potential barrier between said adjacent sections at other time periods.

6. In a charge-coupled imager as set forth in claim 5, at least one of said gate electrode means between each pair of adjacent sections of said C register comprising a storage electrode and a transfer electrode, said transfer electrode for, during one time period, effecting a transfer of charge from one section via the storage electrode to the other section and during other periods of time for preventing the flow of charge from said other section back to said storage electrode.

7. A method of transferring successive, interleaved portions of a row of M charge signals from a first to a second M/N stage charge transfer register, where each such register has M electrode means, where N is an integer and is equal to the number of phases employed to operate the second register; comprising the steps of:

1. transferring the row, in parallel, from the first register to a first temporary storage region decoupled from the second register;
2. transferring the row, in parallel from the first temporary storage region to a second temporary storage region, this one adjacent to the second register and capable of coupling thereto, the M charge signals of the row being aligned with the M electrode means of the second register, respectively;
3. applying one of the phase voltages to each N'th electrode means of the second register for transferring only M/N of the charge signals from the second region to the second register;
4. transferring the remaining M (1−1/N) charge signals from said second back to said first region;
5. removing the charge signals from said second register;
6. repeating steps 2 to 5 a sufficient number of times to transfer all N parts of the row, with step 3 being performed for a different phase and a different group of electrodes for each repetition; and
7. combining with one another in serial interleaved fashion the charge signals removed from the second register during successive steps (5) to reconstitute the row of charge signals removed from the first register.

8. In a charge coupled imaging system having M channels and a plurality of rows and which conventionally is read out a row of M charge signals at a time into an output register means having a number M of stages equal to the number of channels, each stage having N electrode means, N being the number of phases employed to operate said output register means, the improvement comprising:

said output register means having one section with M/N stages, with N electrode means per stage, each group of N adjacent channels being aligned with the N electrode means of a stage, respectively, and said output register means having N−1 temporary storage sections, each with M/N stages, with N electrode means per stage;

means, during 1/N'th of a row time, for shifting 1/N'th of a row from said channels into the M/N stages, respectively, of said one section of said output register, and for returning the remainder of the row to regions of said imaging system isolated from said output register;

means for removing from said one section and temporarily storing in a different one of said temporary storage sections each 1/N'th of a row received thereby except the last 1/N'th of said row;

means for then retrieving from said isolated regions of the array another 1/N'th of the row, transferring this 1/N'th of the row to said one section, and returning the remainder of the row, if any to regions of the imager isolated from said output register, repeating the process a sufficient number of times until the last 1/N'th of the row is stored in said one section, and the remaining 1/N'ths of the row are stored in different temporary storage sections; and means for concurrently reading out said one section and said N−1 temporary storage sections of said output register means, each in serial fashion, and for interleaving the signals as they are being read out to reconstruct the row read from said channels into said output register means.

* * * * *